United States Patent [19]
Takahashi

[11] Patent Number: 6,121,859
[45] Date of Patent: Sep. 19, 2000

[54] SURFACE ACOUSTIC WAVE FILTER WITH STACKED IMPEDANCE MATCHING COILS FOR DISCHARGING STATIC ELECTRICITY

[75] Inventor: Satoshi Takahashi, Shizuoka, Japan

[73] Assignee: NEC Corporation, Tokyo, Japan

[21] Appl. No.: 09/270,823

[22] Filed: Mar. 18, 1999

[30] Foreign Application Priority Data

Mar. 26, 1998 [JP] Japan ................................. 10-078827

[51] Int. Cl.[7] .................................................. H03H 9/64
[52] U.S. Cl. .................. 333/193; 310/313 R; 310/313 B
[58] Field of Search ................................. 333/193–196; 310/313 R, 313 B, 313 C, 313 D

[56] References Cited

U.S. PATENT DOCUMENTS

| | | | |
|---|---|---|---|
| 4,297,660 | 10/1981 | Ieki et al. ................................. | 333/194 |
| 4,409,567 | 10/1983 | Setsune et al. ...................... | 333/194 X |
| 4,625,184 | 11/1986 | Niitsuma et al. .................... | 333/193 X |
| 5,581,141 | 12/1996 | Yamada et al. ...................... | 333/195 X |
| 5,619,175 | 4/1997 | Bauregger ............................ | 333/193 X |
| 5,699,026 | 12/1997 | Kurp et al. ............................. | 333/193 |

FOREIGN PATENT DOCUMENTS

| | | | |
|---|---|---|---|
| 55-33382 | 3/1980 | Japan ..................................... | 333/193 |
| 56-156015 | 12/1981 | Japan ..................................... | 333/193 |
| 2-237211 | 9/1990 | Japan ..................................... | 333/193 |
| 3-29407 | 2/1991 | Japan . | |
| 3-128518 | 5/1991 | Japan . | |
| 3-220911 | 9/1991 | Japan ..................................... | 333/193 |
| 3-258010 | 11/1991 | Japan ..................................... | 333/193 |
| 4-280112 | 10/1992 | Japan ..................................... | 333/193 |
| 4-288720 | 10/1992 | Japan ..................................... | 333/193 |
| 4-354412 | 12/1992 | Japan ..................................... | 333/193 |
| 8-167826 | 6/1996 | Japan . | |

Primary Examiner—Robert Pascal
Assistant Examiner—Barbara Summons
Attorney, Agent, or Firm—McGuire Woods, LLP

[57] ABSTRACT

A surface acoustic wave filter is formed by arranging electrode portions, each obtained by interdigitally forming a pair of comb electrodes on a piezoelectric substrate to oppose each other at a predetermined distance, on input and output sides, respectively. Each electrode portion includes an impedance matching circuit.

7 Claims, 9 Drawing Sheets

SURFACE ACOUSTIC WAVE FILTER WITH STACKED IMPEDANCE MATCHING COILS FOR DISCHARGING STATIC ELECTRICITY

BACKGROUND OF THE INVENTION

1. Field of the Invention

The present invention relates to a surface acoustic wave filter used in a filter for a pager or the like and, more particularly, to a surface acoustic wave filter capable of preventing electrostatic breakdown between filter patterns formed on a substrate surface.

2. Description of the Prior Art

In a surface acoustic wave filter, electrode portions, each obtained by interdigitally forming a pair of comb electrodes on a piezoelectric substrate to oppose each other at a predetermined distance, are arranged on the input and output sides, respectively. In order to use one and the other of the two arranged electrode portions as input and output side electrode portions, respectively, an input terminal is connected to one comb electrode of the input side electrode portion, an output terminal is connected to one comb electrode of the output side electrode portion, and the other comb electrode of each of the input and output side electrode portions is grounded, so that a signal input to the input terminal is output from the output terminal.

In each electrode portion of the surface acoustic wave filter, the adjacent electrode fingers of the pair of comb electrodes have a small gap from each other. When high-voltage static electricity or the like is applied to the electrode portion, a leakage current flows between the comb electrodes.

Such static electricity application occurs not only during normal use but also during the manufacturing process of the surface acoustic wave filter or while the surface acoustic wave is stocked as a final product, when the electrode portion comes into contact with a portion of a surrounding device, and the like, charged with the static electricity.

When a leakage current flows between the comb electrodes, dielectric breakdown occurs between the electrodes, and the product becomes defective.

In order to prevent inconveniences caused by application of the static electricity, each electrode may be coated with an antistatic agent. However, this is not effective for static electricity occurring before the antistatic agent is applied. Furthermore, application of the antistatic agent can sometimes change the characteristics of the surface acoustic wave filter.

SUMMARY OF THE INVENTION

The present invention has been made in consideration of the above situation in the prior art, and has as its object to provide a surface acoustic wave filter in which interelectrode breakdown caused by application of static electricity can be prevented so as not to cause a defect in the product.

In order to achieve the above object, according to the main aspect of the present invention, there is provided a surface acoustic wave filter formed by arranging electrode portions, each obtained by interdigitally forming a pair of comb electrodes on a piezoelectric substrate to oppose each other at a predetermined distance, on input and output sides, respectively, wherein each of the electrode portions comprises impedance matching means.

In connection with this main aspect, the present invention has auxiliary aspects as follows.

The impedance matching means according to the above main aspect is formed on each of an input side of the input side electrode portion and an output side of the output side electrode portion.

The impedance matching means according to the above main aspect includes a coil and/or capacitor.

The impedance matching means according to the above main aspect is formed on a substrate formed with the electrode portions.

With the surface acoustic wave filter according to the present invention having the respective aspects as described above, even when static electricity is applied to the input or output terminal, the static electricity can be discharged to ground through the impedance matching coil and/or the capacitor, so that interelectrode breakdown caused by static electricity does not occur.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Several preferred embodiments of the present invention will be described in detail with reference to the accompanying drawings.

Figure 1:
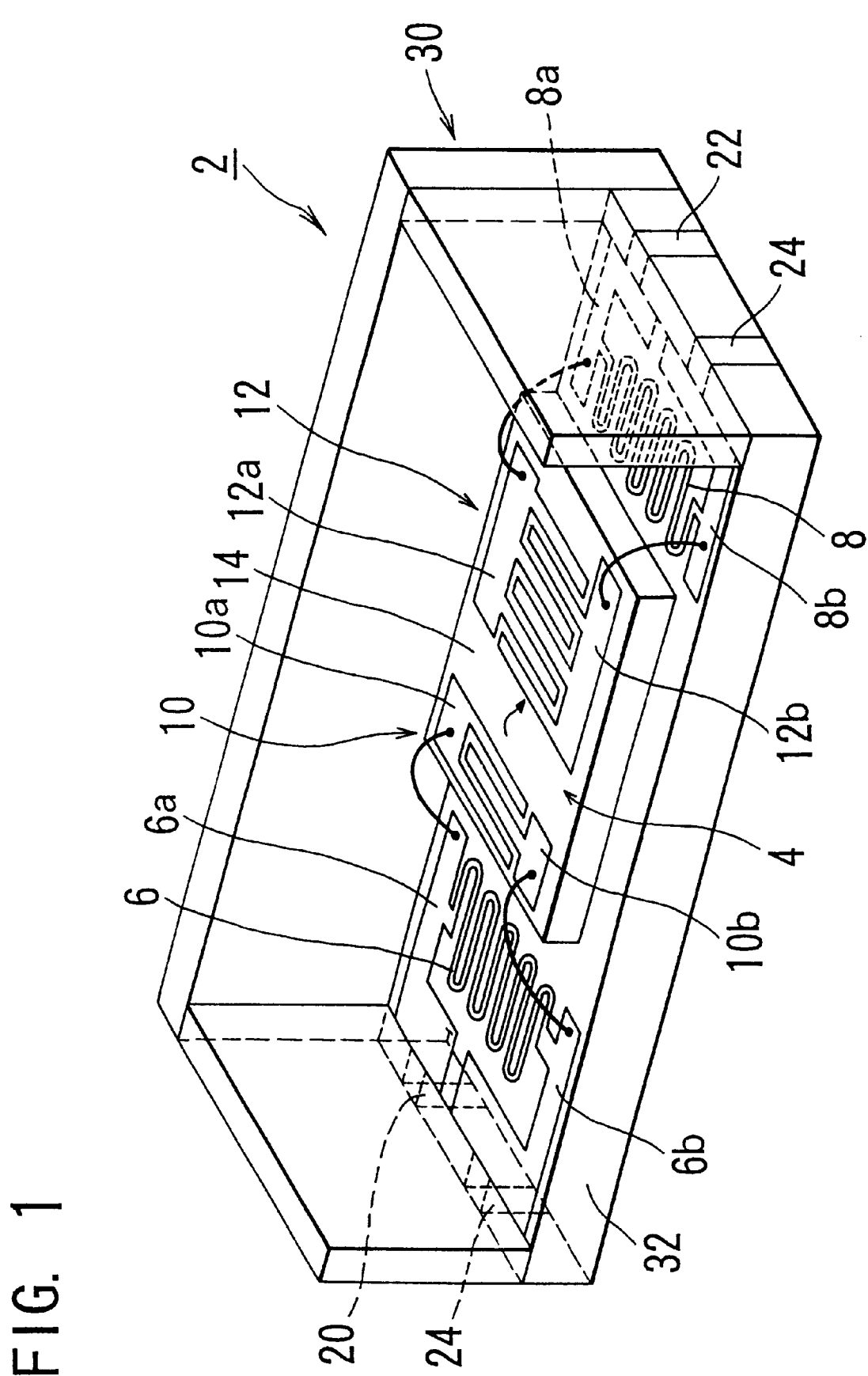
FIG. 1 is a perspective view showing the schematic arrangement of a surface acoustic wave filter according to the first embodiment of the present invention.

A surface acoustic wave filter 2 as the first embodiment of the present invention is constituted by an outer casing 30, a chip 4 stored in the outer casing 30, coils 6 and 8, and the like, as shown in FIG. 1.

Figure 3:
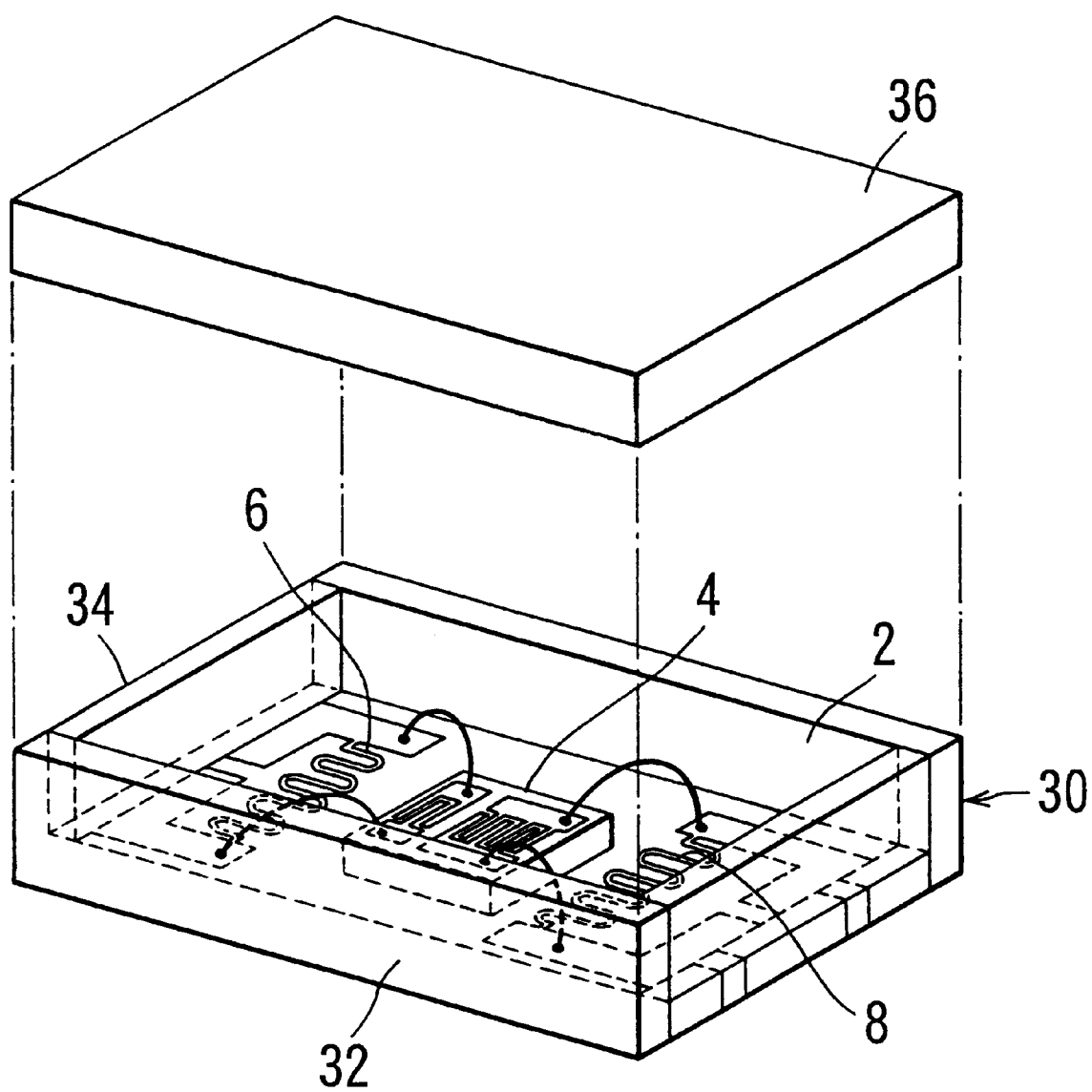
FIG. 3 is a perspective view schematically showing the entire arrangement of the first embodiment of the present invention.

The outer casing 30 is constituted by a substrate 32 defining the bottom surface, surrounding side walls 34, a lid 36, and the like, as shown in FIG. 3. The chip 4 is constituted by a piezoelectric member 14 having a piezoelectric function, and first and second electrode portions 10 and 12 formed on the piezoelectric member 14, as shown in FIG. 1.

Figure 6:
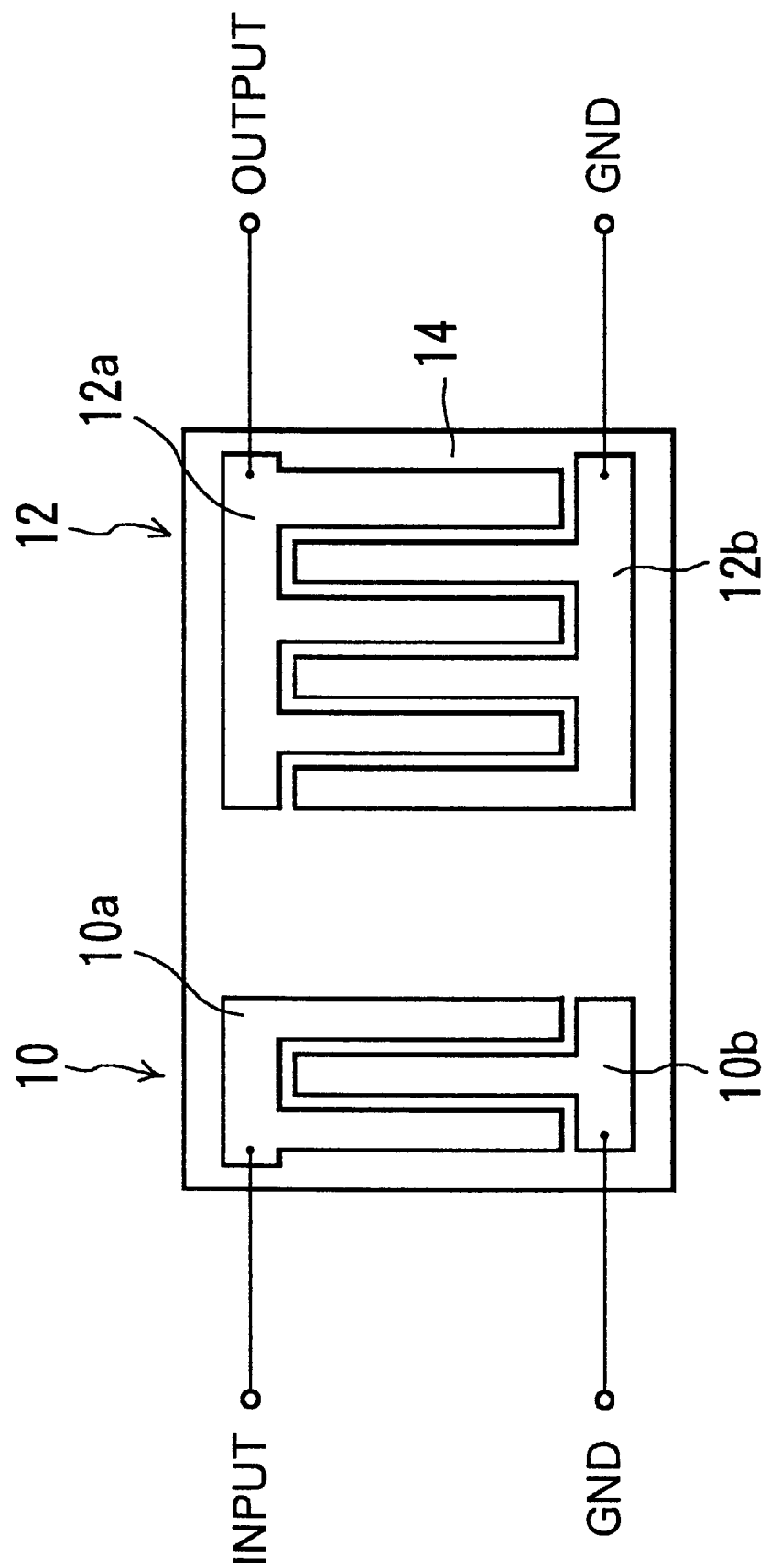
FIG. 6 is a plan view showing an example of the electrode portion of the surface acoustic wave filter according to the present invention.

The first electrode portion 10 is an input side electrode and consists of a first comb electrode 10a and an output-side second comb electrode 10b that are interdigital with each other, as shown in FIG. 6. The electrode fingers of the first and second comb electrodes 10a and 10b interdigitate with each other so that the electrodes 10a and 10b oppose each other at a predetermined distance.

The second electrode portion 12 is an output side electrode and consists of a third comb electrode 12a and a fourth comb electrode 12b that are interdigital with each other, in the same manner as the first electrode portion 10, and oppose each other in the same manner as in the first electrode portion 10. The first and second electrode portions 10 and 12 are formed on the piezoelectric member 14 by printing in accordance with the photomechanical process, or by other methods.

The first comb electrode 10a is connected to an input terminal 20 formed on one side of the outer casing 30, and the third comb electrode 12a is connected to an output terminal 22 formed on the other side of the outer casing 30. The second and fourth comb electrodes 10b and 12b are respectively connected to ground terminals 24.

The coils 6 and 8 are impedance matching coils formed to have a predetermined impedance. One end portion 6a of the coil 6 is connected to the first comb electrode 10a, and the other end portion thereof 6b is connected to the second comb electrode 10b. One end portion 8a of the coil 8 is connected to the third comb electrode 12a, and the other end thereof is connected to the fourth comb electrode 12b.

Figure 2:
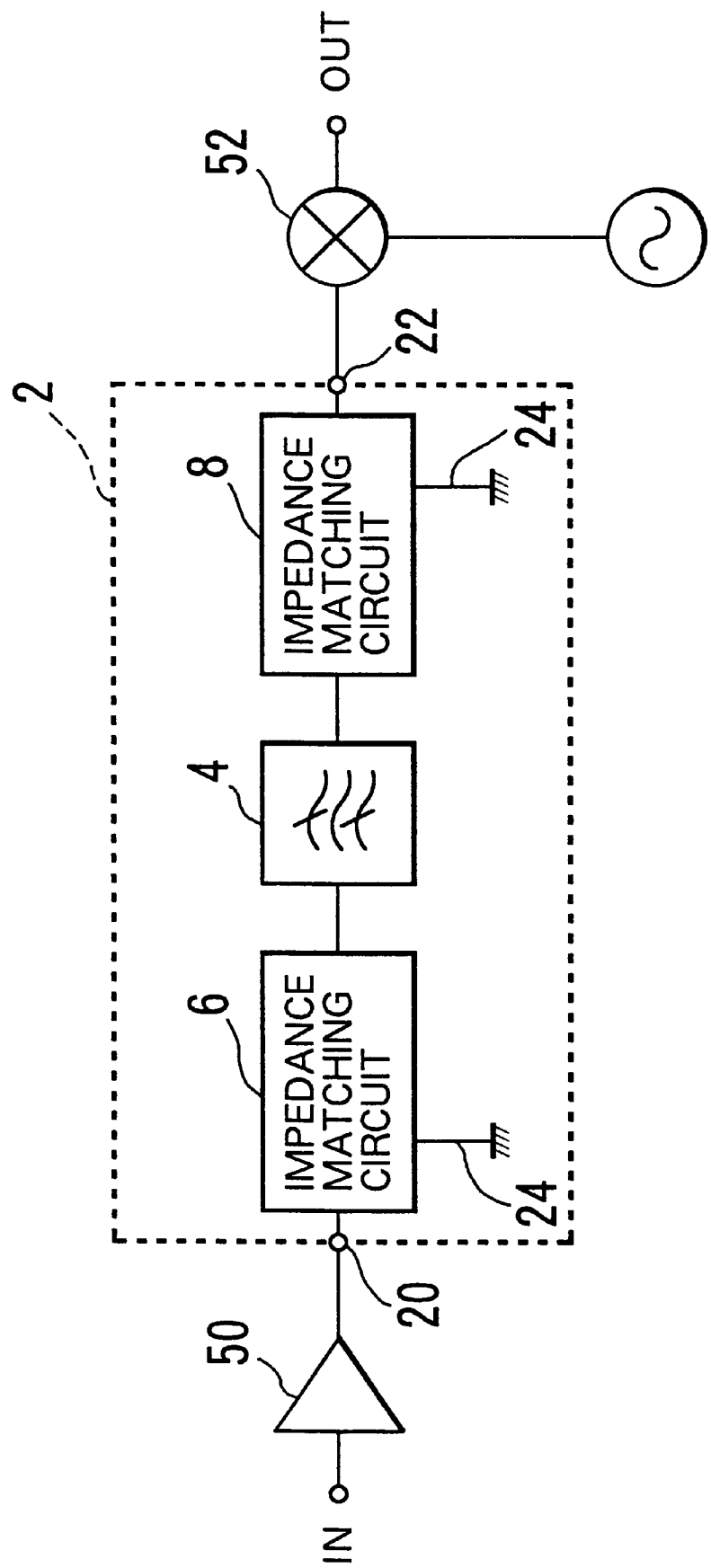
FIG. 2 is a circuit diagram showing an example of the circuit of the surface acoustic wave filter according to the present invention.

FIG. 2 shows the circuit arrangement of the surface acoustic wave filter 2. The matching coils 6 and 8 are connected to the input and output sides, respectively, of the chip 4. The coil 6 is connected to an amplifier 50, and the coil 8 is connected to a mixer 52.

Accordingly, in the surface acoustic wave filter 2, even if high-voltage static electricity is applied from the amplifier 50 side to the input terminal 20, the applied static electricity is discharged to the ground terminal 24 through the coil 6. A high voltage is not generated by the static electricity between the first and second comb electrodes 10a and 10b, and interelectrode breakdown is not caused by the static electricity.

Similarly, even if static electricity is applied from the mixer 52 side to the output terminal 22, it is discharged to the ground terminal 24 through the coil 8. A high voltage is not generated by application of the static electricity between the electrode fingers of the third and fourth comb electrodes 12a and 12b, and interelectrode breakdown is not caused by the static electricity.

Figure 4:
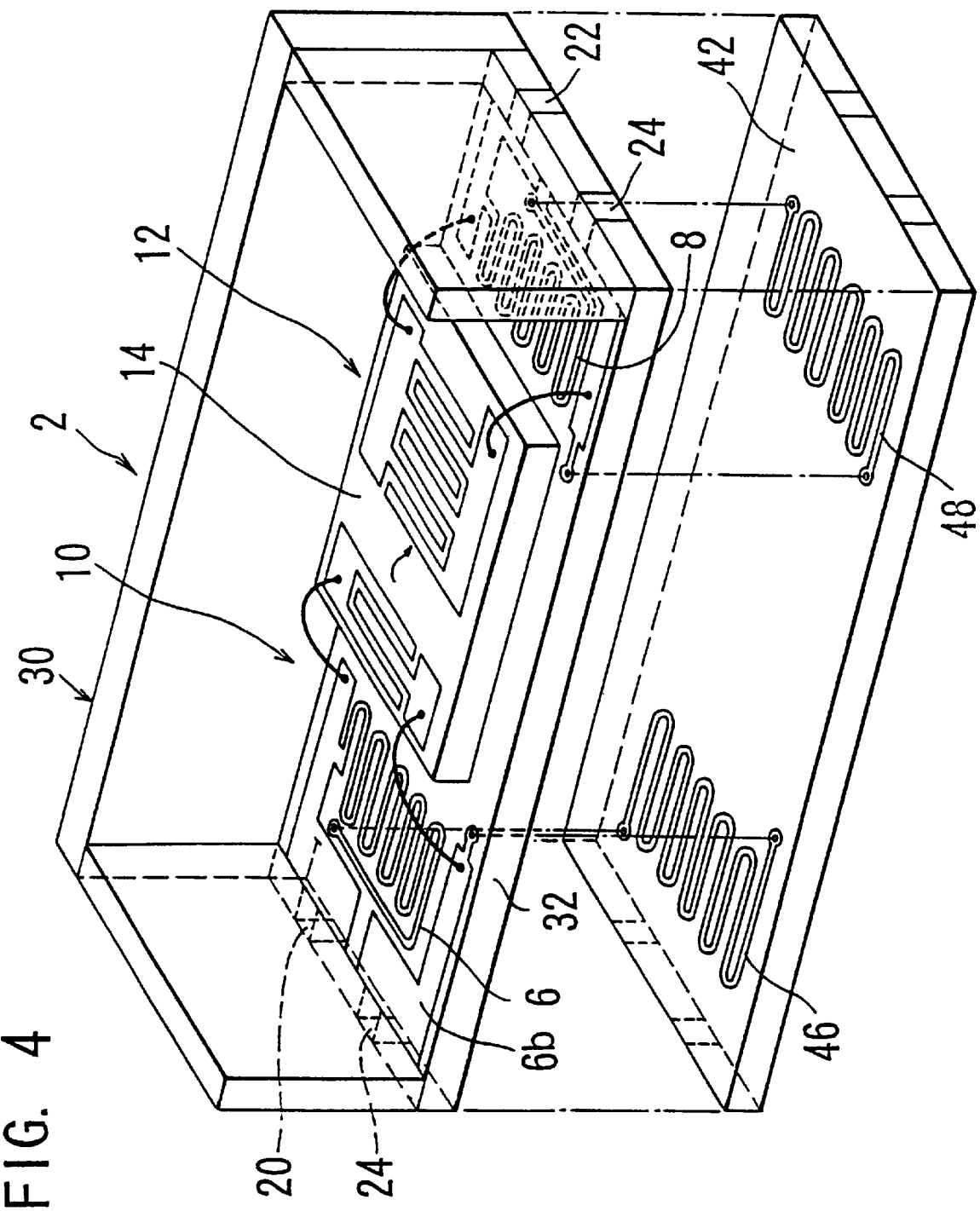
FIG. 4 is a perspective view showing the schematic arrangement of a surface acoustic wave filter according to the second embodiment of the present invention.

FIG. 4 shows the second embodiment of the present invention.

In the second embodiment, a second substrate 42 is placed under a substrate 32 in a multilevel manner. The second substrate 42 is formed with a coil 46 to be connected to a coil 6 of the substrate 32. More specifically, as shown in FIG. 4, the second substrate 42 is attached to the lower side of the substrate 32, and the coil 46 and a coil 48 formed on the second substrate 42 are connected in series to the coil 6 and a coil 8, respectively.

This can extend the coil length without increasing the bottom area of the substrate 32. Even when the impedance of the coil 6 and the like is small, an impedance condition necessary for an impedance matching coil can be satisfied.

Figure 5A:
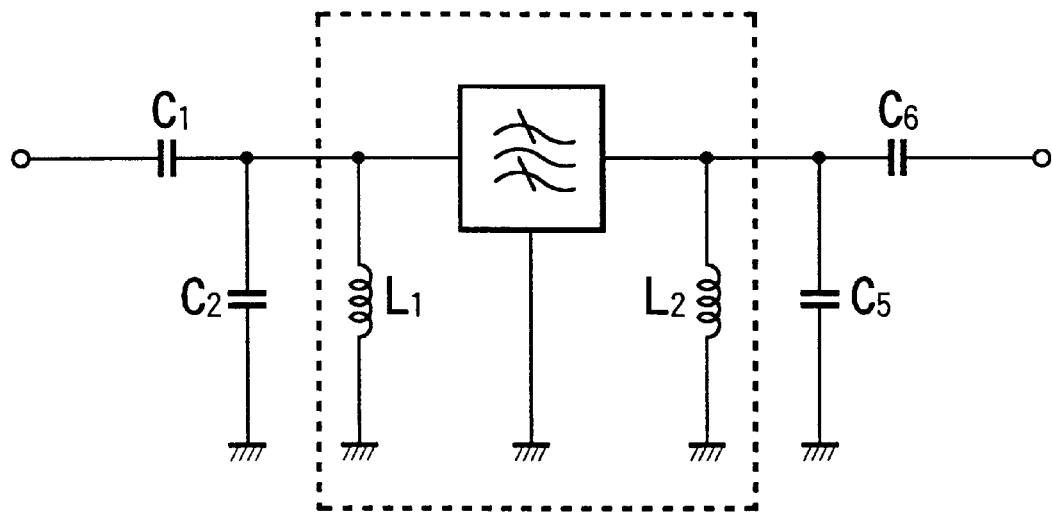
FIGS. 5A and 5B are circuit diagrams respectively showing other examples of the circuit of the surface acoustic wave filter according to the present invention.
Figure 5B:
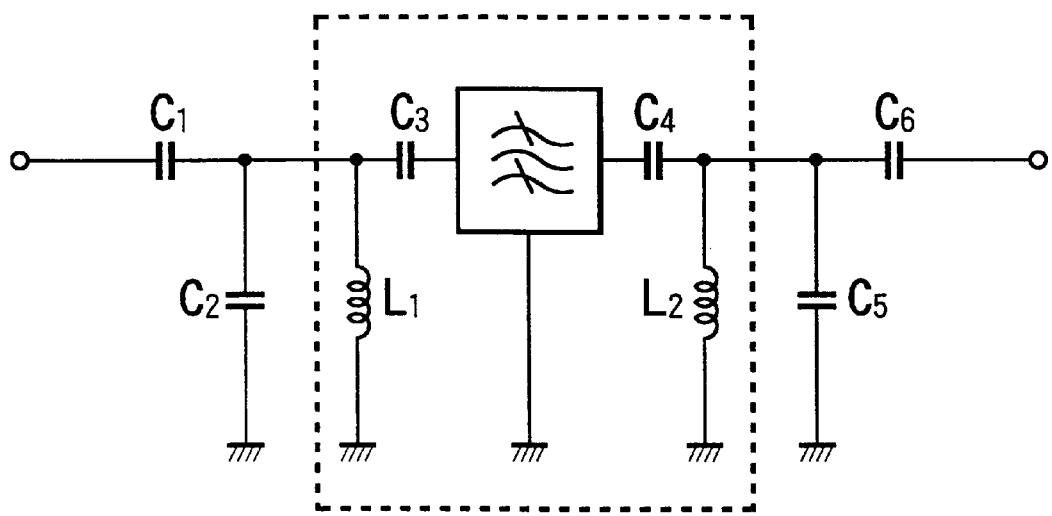
Figure 7:
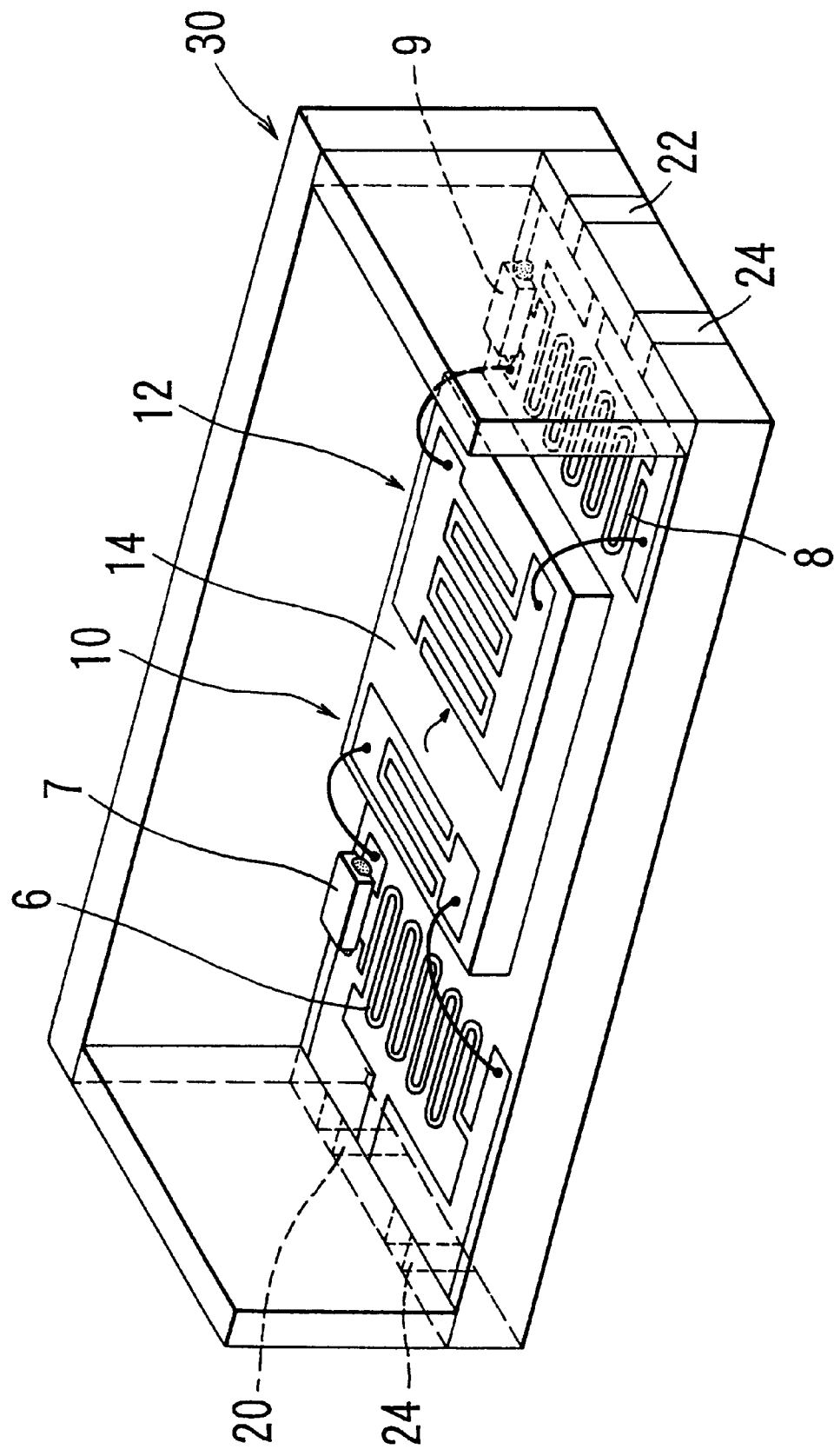
FIG. 7 is a perspective view showing the schematic arrangement of a surface acoustic wave filter according to the third embodiment of the present invention.

Assume that for a circuit having an impedance represented by "$L_1$, $L_2$, $C_3$, and $C_4$, the impedance matching circuit requires capacitors $C_1$, $C_2$, $C_5$, and $C_6$, as in circuits shown in FIGS. 5A and 5B. In this case, according to the third embodiment of the present invention, capacitors 7 and 9, together with coils 6 and 8, are formed on a substrate 32, as shown in FIG. 7. This can cope with a case wherein a surface acoustic wave filter requires capacitors.

Figure 8:
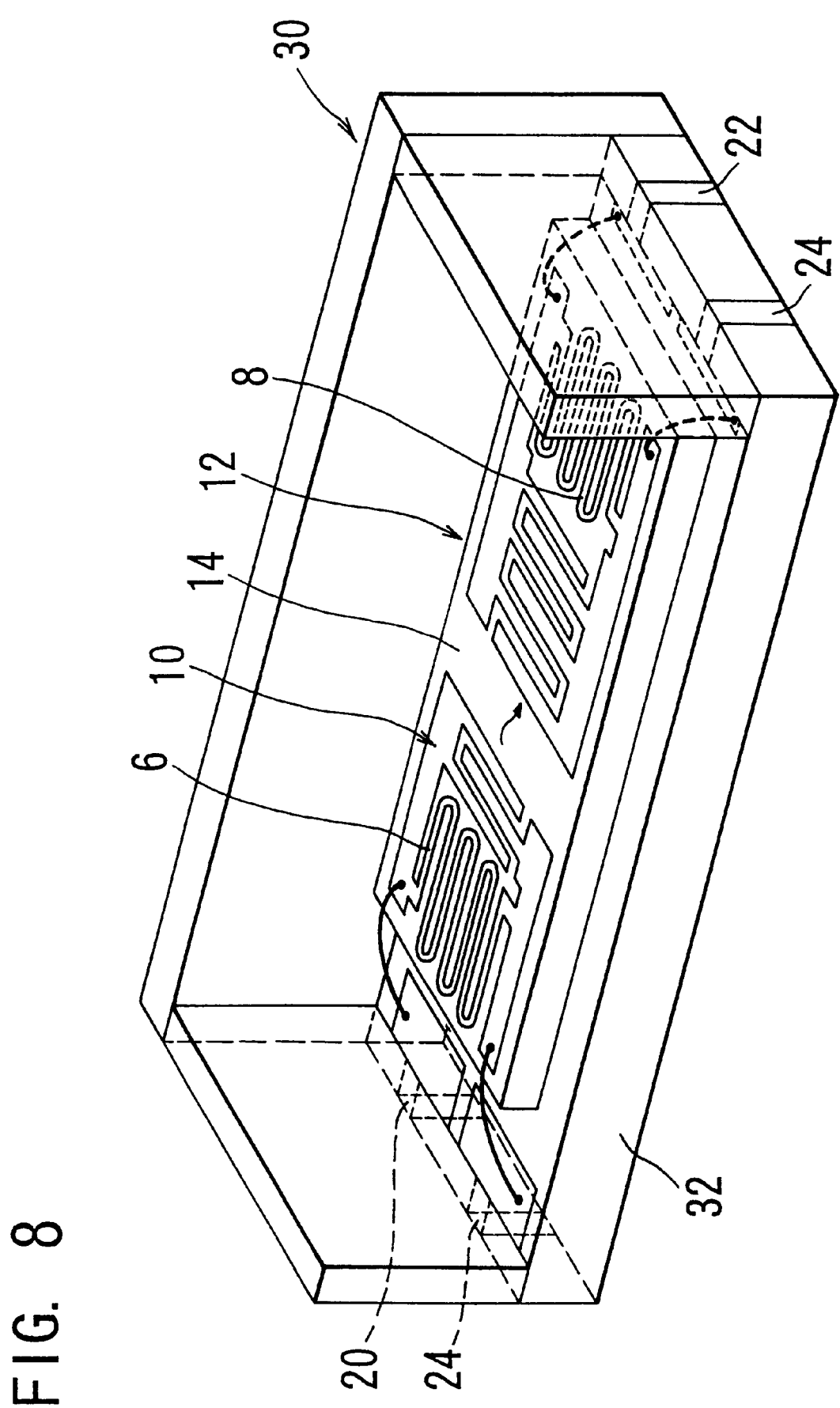
FIG. 8 is a perspective view showing the schematic arrangement of a surface acoustic wave filter according to the fourth embodiment of the present invention.

According to the fourth embodiment of the present invention, impedance matching circuits such as a coil 6 and the like may be formed not on the substrate 32 but on a piezoelectric substrate 14, as shown in FIG. 8.

Figure 9:
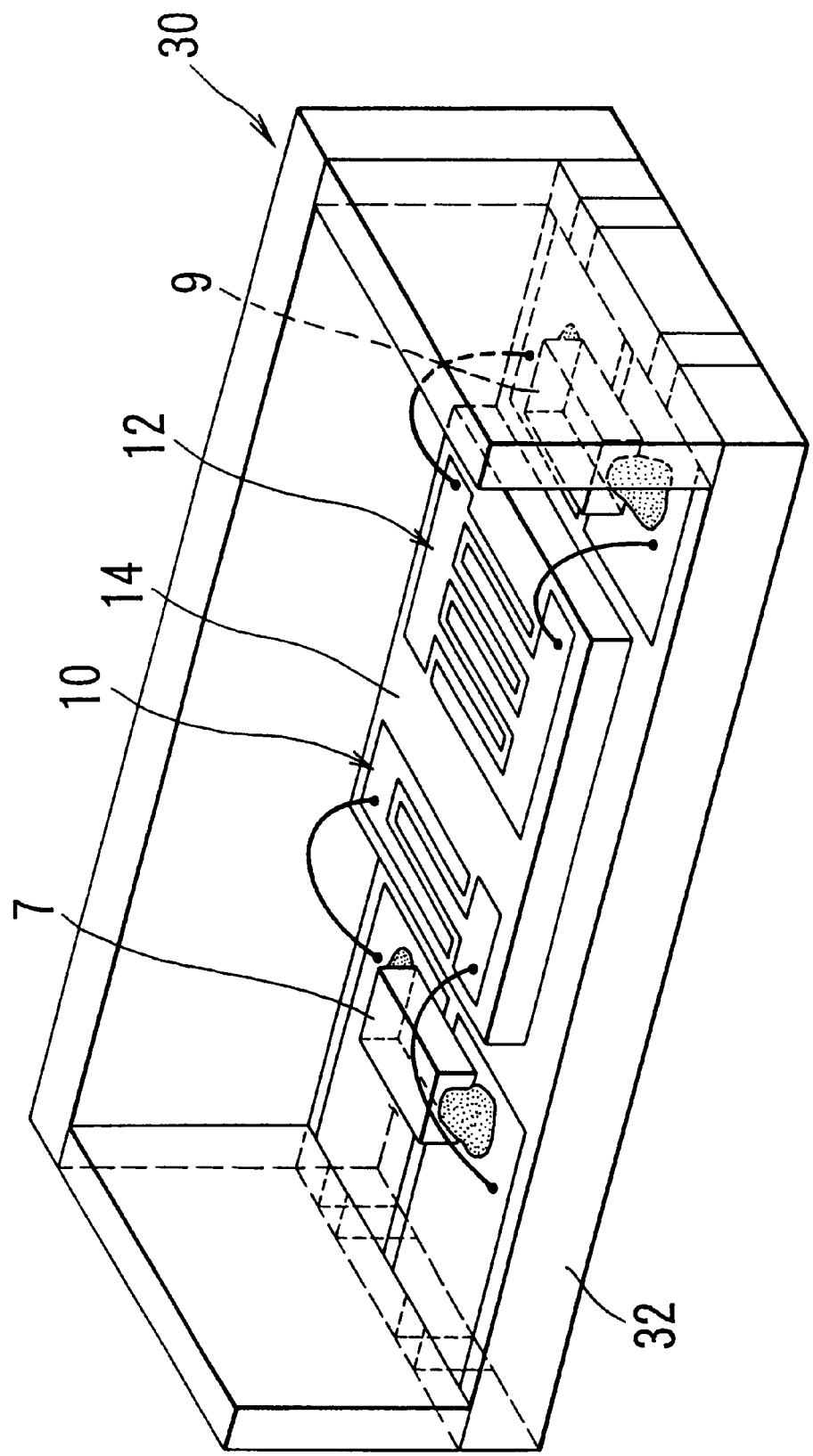
FIG. 9 is a perspective view showing the schematic arrangement of a surface acoustic wave filter according to the fifth embodiment of the present invention.

According to the fifth embodiment of the present invention, no coil may be used but only a capacitor 7 may be connected, as shown in FIG. 9.

What is claimed is:

1. A surface acoustic wave filter, comprising:

a piezoelectric member positioned on a first substrate;

a first pair of comb electrodes interdigitally formed on said piezoelectric member at and input side of said acoustic wave filter;

second pair of comb electrodes interdigitally formed on said piezoelectric member at an output side of said acoustic wave filter; and first and second impedance matching means, respectively connected between said first and second pair of comb electrodes and ground, for discharging static electricity from said input side or said output side to ground, said first and second impedance matching means having a first portion formed on said first substrate and a second portion formed on a second substrate stacked with said first substrate in a multi-level fashion.

2. A filter according to claim 1, wherein said first and second impedance matching means each comprises a coil.

3. A filter according to claim 2 wherein each said coil is a pattern coil.

4. A filter according to claim 1, wherein said first and second impedance matching means each comprises a coil and a capacitor.

5. A filter according to claim 4, wherein each said coil is a pattern coil.

6. A surface acoustic wave filter having static electricity protection, comprising:

a first substrate;

a piezoelectric member positioned on said first substrate;

a pair of comb electrodes for an acoustic wave filter positioned on said piezoelectric member;

an impedance matching circuit comprising a first coil on said first substrate connected to said pair of comb electrodes and ground for discharging static electricity to prevent damage to said pair of comb electrodes;

a second substrate stacked with said first substrate; and a second coil formed on said second substrate connected in series with said first coil, said second coil on said second substrate for extending the length of the first coil without increasing the surface area of said first substrate.

7. A surface acoustic wave filter as recited in claim 6 wherein said pair of comb electrodes and impedance matching circuit are positioned at an input side of said acoustic filter and further comprising a second pair of comb electrodes and a second impedance matching circuit positioned at an output side of said acoustic filter.

* * * * *